United States Patent [19]
Wood

[11] Patent Number: 5,731,752
[45] Date of Patent: Mar. 24, 1998

[54] MICROWAVE SIGNAL FREQUENCY MULTIPLIER

[75] Inventor: James Richard Wood, Grapevine, Tex.

[73] Assignee: Loral Vought Systems Corporation, Grand Prairie, Tex.

[21] Appl. No.: 633,576

[22] Filed: Apr. 17, 1996

[51] Int. Cl.$^6$ .................................................. H01P 1/20
[52] U.S. Cl. ............................................ 333/218; 327/123
[58] Field of Search ........................... 333/218; 327/119, 327/123

[56] References Cited

U.S. PATENT DOCUMENTS

| | | | |
|---|---|---|---|
| 3,631,331 | 12/1971 | Fairley et al. | 333/218 |
| 3,742,335 | 6/1973 | Konishi | 333/218 X |
| 4,595,892 | 6/1986 | Martinetti et al. | 333/218 |
| 4,636,758 | 1/1987 | Mettoudi | 333/218 |
| 4,712,121 | 12/1987 | Yokoyama | 257/15 |
| 4,996,505 | 2/1991 | Keilmann | 333/218 |
| 5,278,427 | 1/1994 | Choi | 257/17 |
| 5,422,613 | 6/1995 | Nativ | 333/218 |

OTHER PUBLICATIONS

Article: "Applications of Photonic Band Gap Structures" by Henry O. Everitt; *Optics & Photonics News*, Nov. 1992, pp. 20–23.

Article: "60 GHz Reflection Gain Based on Superlattice Negative Differential Conductance" by M. Hadjazi et al., *Electronics Letters*, Apr. 15, 1993, vol. 29, No. 8.

Article: "Low–loss Microwave Cavity Using Layered–Dielectric Materials" by C.J. Maggiore et al., *1994 American Inst. of Physics. Appl. Phys. Lett.* 64(11), Mar. 1994, pp. 1451–1453.

Article: White Paper Proposal, "High Power, High Efficiency, Monolithic Quasi–Optical Frequency Tripler Using Microwave Power Module Drivers" by N. C. Luhmann, Jr., Feb. 27, 1996, *Department of Applied Science, UC Davis*, 26 pages.

Article: "Photonic Band–gap Structures" by E. Yablonovitch, *1993 Optical Society of America*, vol. 10, No. 2/Feb. 1993, pp. 283–295.

Article: "Resonant Second Harmonics Generation of the Submillimeter Surface Wave in the Semiconductor Superlattice Bounded by a Metal" by K. N. Ostrikov et al.; *IEEE Antennas and Propagation Society Int'l Symposium, 1995 Digest*, vol. 1, pp. 742–745.

Article: "Quantum Well Devices for Millimetre Wave Applications" by D. Lippens; *23rd European Microwave Conference*, Madrid, Spain, Sep., 1993, pp. 61–66.

Article: "Multi-state Superlattice–Emitter Resonant–Tunneling Bipolar Transistor with Circuit Applications" by W. Lour; *Superlattices and Microstructures*, 1993 Academic Press Ltd., pp. 81–86.

(List continued on next page.)

*Primary Examiner*—Paul Gensler
*Attorney, Agent, or Firm*—Sidley & Austin

[57] ABSTRACT

A microwave signal frequency multiplier is used to produce a harmonic signal derived from a microwave pump signal. In a selected embodiment, a Ka pump signal is converted to a W band microwave signal. The frequency signal multiplier includes a housing having a signal input port and a harmonic signal extraction port. The interior of the housing comprises a pump signal cavity which is tuned to the pump signal. Within the pump signal cavity, there is provided a non-linear material which converts the pump signal to a harmonic, preferably a third harmonic, of the pump signal. A frequency selective barrier within the pump signal cavity defines a harmonic signal cavity. An extraction port is coupled to the harmonic signal cavity for removing the harmonic signal from the multiplier. The frequency selective barrier is essentially transparent to the pump signal but is reflective to the harmonic signal. A preferred embodiment for the non-linear multiplier for producing the harmonic signal is a doped semiconductor superlattice. The frequency selective material may also be fabricated as a superlattice.

38 Claims, 3 Drawing Sheets

OTHER PUBLICATIONS

Article: "Current State and Future Challenge in Molecular Beam Epitaxy (MBE) Research" by A. Y. Cho; *Molecular Beam Epitaxy 1988, Sapporo, Japan; Reprinted from Journal of Crystal Growth 95* (1989) No. 104, pp. 1–10.

Article: "Quantum Effect Devices: Physics and Applications" by Federico Capasso, edited by Anastassakis & Joannopoulos, *20th International Conference on The Physics of Semiconductor*, Aug. 1990, pp. 379–386.

Article: "Frequency Multiplier for Millimeter Wave Applications" by J. Liao, *Riken Review No. 11*, Dec. 1995, pp. 5–6.

Article: "Frequency Multiplications of Microwave Radiation in a Semiconductor Superlattice by Electrons Capable to Perform Bloch Oscillations" by Grenzer et al. *Annalen der Physik*, Apr. 1995, pp. 265–271.

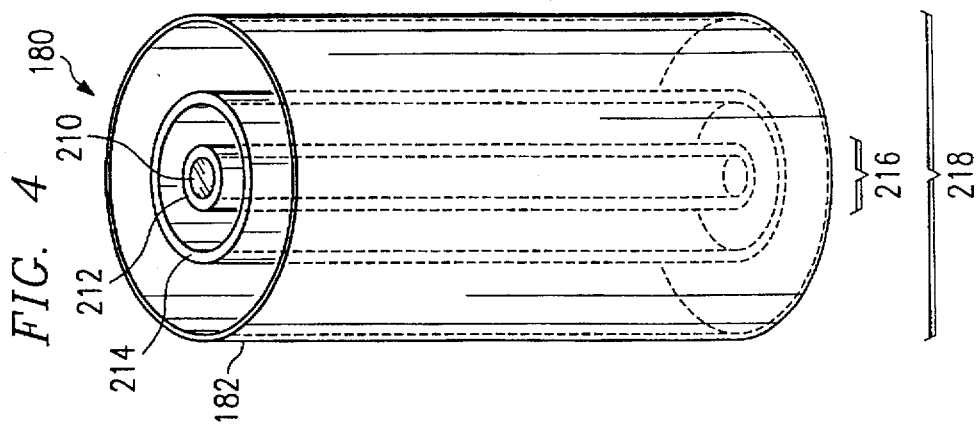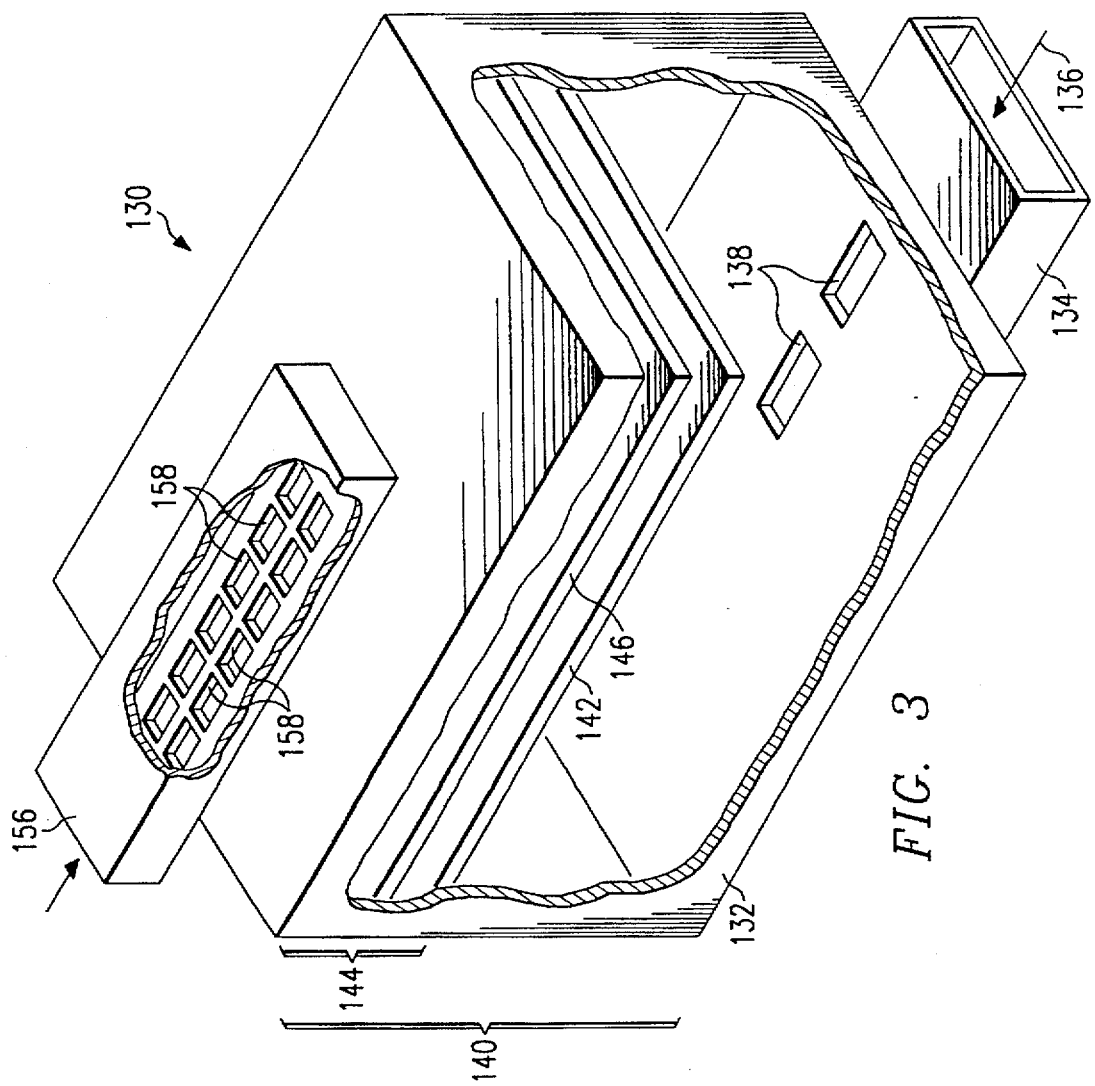

MICROWAVE SIGNAL FREQUENCY MULTIPLIER

TECHNICAL FIELD OF THE INVENTION

The present invention pertains in general to a signal frequency multiplier and in particular to such a multiplier which operates at microwave frequencies.

BACKGROUND OF THE INVENTION

The resolution and effectiveness of radar systems, such as a tracking system for a missile, are often enhanced by the use of high microwave frequencies. However, high power levels of signals at high microwave frequencies are difficult to generate. The efficiency of operation of devices to directly generate high microwave frequencies is generally low and the amount of power that can be directly generated at relatively high microwave frequencies is also low. One approach to this problem is to generate a high amplitude of microwave power at a low microwave frequency and through a relatively efficient process convert the low frequency microwave energy to high frequency. This is done by a device which is generally termed a frequency multiplier. One such frequency multiplier is described in a white paper proposal entitled "High Power, High Efficiency, Monolithic Quasi-Optical Frequency Triplets Using Microwave Power Module Drivers" by N. C. Luhmann, Jr. dated Feb. 27, 1996. The frequency multiplier described in this paper is an elongate waveguide device which includes input and output filters and a multiplier array comprising diodes with antenna leads. The multiplier array produces a third harmonic signal from the input microwave signal. The described device has an input signal frequency at Ka band and produces a third harmonic signal which is in the range of 80–110 gHz. The input power is 10 watts and the efficiency is approximately 30% to produce an output power of approximately 3 watts. The article also describes proposed units having higher driving powers.

In an aerospace application, such as a missile tracking radar, there is a need for a frequency multiplier which is efficient, compact and rugged. The present invention is directed to a microwave signal frequency multiplier which can achieve improvements in the art in these characteristics.

SUMMARY OF THE INVENTION

A selected embodiment of the present invention is a microwave frequency signal multiplier which includes a pump signal cavity that has an input port for receiving a pump signal. A microwave frequency non-linear medium is positioned within the pump signal cavity for receiving the pump signal and producing from that signal a harmonic signal of the pump signal. A frequency selective barrier is positioned within the pump signal cavity to define a harmonic signal cavity. The frequency selective barrier is substantially transparent to the pump signal and is substantially reflective to the harmonic signal. An extraction port is provided which extends into the harmonic signal cavity and serves to transfer the harmonic signal from the harmonic signal cavity to the exterior of the microwave frequency signal multiplier.

BRIEF DESCRIPTION OF THE DRAWINGS

For a more complete understanding of the present invention and the advantages thereof, reference is now made to the following description taken in conjunction with the accompanying drawings in which:

FIG. 3 is a further embodiment of the present invention wherein there is a waveguide input into a rectangular pump signal cavity and a waveguide output from a harmonic signal cavity, FIG. 4 is a still further embodiment of the present invention having a cylindrical configuration, an interior cylindrical pump signal cavity and a cylindrical harmonic signal cavity.

DETAILED DESCRIPTION OF THE INVENTION

Figure 1:
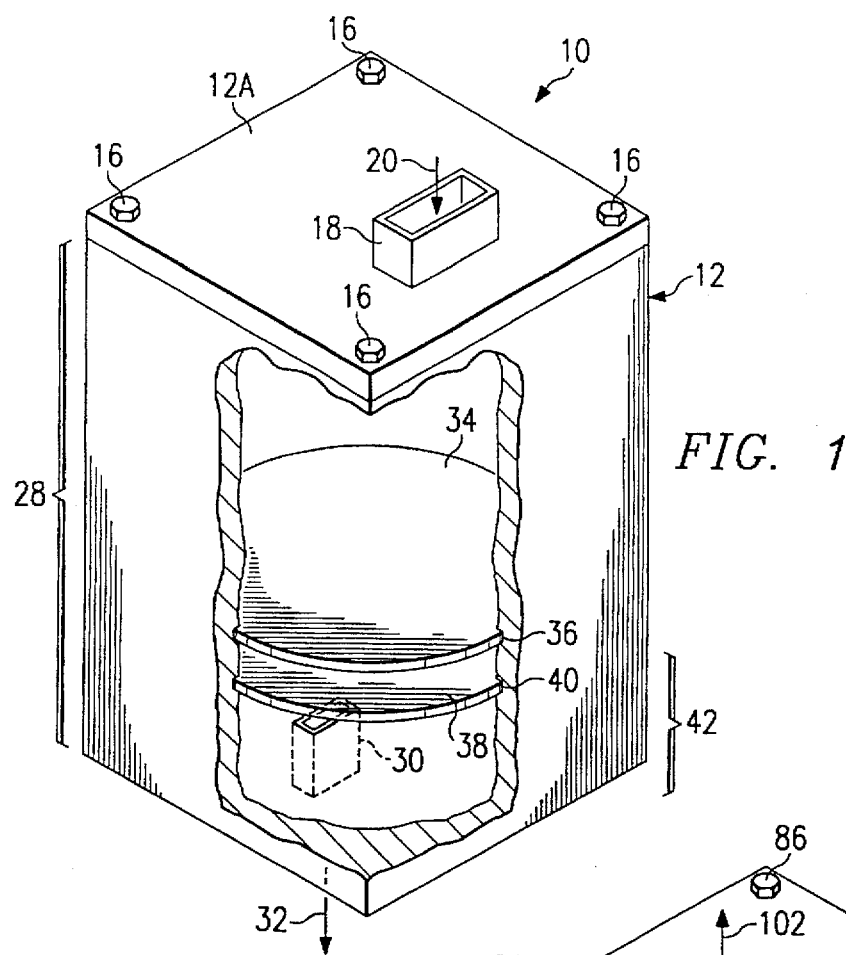
FIG. 1 is a perspective, cut-away illustration of a microwave frequency signal multiplier in accordance with the present invention wherein a microwave pump signal is transmitted through a waveguide into a cylindrical cavity that includes a non-linear medium and a frequency selective barrier for producing a harmonic signal of the pump signal.

Referring now to FIG. 1, there is shown a microwave signal frequency multiplier 10 in accordance with the present invention. A housing 12 includes a rectangular block of conductive material, such as copper. The housing 12 includes an end plate 12A made of similar material and secured by screws 16 to the remainder of the housing 12. A rectangular waveguide 18 comprises an input port to the multiplier A microwave pump signal is provided to the waveguide 18 as indicated by the arrow 20.

A cylindrical chamber is formed within the housing 12 and this chamber constitutes a pump signal cavity 28. The top of the cavity 28 is closed by the plate 12A.

A waveguide 30 extends through the bottom of the housing 12. A microwave harmonic signal is transmitted from the cavity 28 to the exterior of the housing 12 through the waveguide 30. The harmonic microwave signal is indicated by an arrow 32.

A frequency selective barrier 34 having a disk configuration is positioned in the cavity 28 and within a groove 36. A non-linear material 38 having a disk configuration is positioned between the barrier 34 and the lower end of cavity 28 in a groove 40. The portion of cavity 28 between the frequency selective barrier 34 and the bottom of the cavity 28 comprises a harmonic signal cavity 42.

In a preferred embodiment, the housing 12, together with the plate 14, is a rectangular solid. The input pump signal is preferably at Ka band and the output signal is a third harmonic of the Ka band pump signal and is in the W band. The output signal is the harmonic signal. In a desired embodiment, the Ka band pump signal has a power of 300 watts and the resulting W band output signal has a power of approximately 100 watts.

The pump signal cavity 28 is preferably tuned to match the pump signal and the harmonic signal cavity 42 has dimensions such that it is tuned to the harmonic signal that is transmitted through the waveguide 30. If the selected pump signal has a frequency of 25 gHz, then the resulting third harmonic signal has a frequency of 75 gHz. The pump signal cavity for a particular embodiment is a function of the frequency used in the cavity as is well known in the art. Likewise, the harmonic signal cavity is determined in the same manner.

The frequency selective barrier 34 is a disk which is a reflective barrier at certain microwave frequencies and is transparent to other microwave frequencies. The barrier 34 is substantially transparent to the input pump signal, but is reflective to the harmonic signal. A frequency selective material can be used as described in "Low-Loss Microwave Cavity Using Layered-Dielectric Materials" by C. J. Maggiore, et al. in *Appl. Phys. Lett.* 64 (11), Mar. 14, 1994, starting at p. 1451. The material described in this paper is a superlattice.

The non-linear material 38 produces a third harmonic of the pump signal. An example of such a non-linear material is a doped superlattice which comprises a photonic band gap structure. Such structures are described in "Photonic Band-Gap Structures" by E. Yablonovitch in *Journal of the Optical Society of America Bulletin*, Volume 10, No. 2, Feb. 1993, pp. 283–295. As described in the article, the dimensions of the material are a function of the operating frequency. An applicable photonic band gap structure is further described in "Applications of Photonic Band Gap Structures" by Henry O. Everitt in *Optics and Photonics News*, Nov. 1992, pp. 20–23.

A further option for the non-linear material is a diode grid array as described in the above-identified article to Luhmann, Jr.

A frequency selective material for the barrier 34 is also described in the Yablonovitch article noted above.

Referring to FIG. 1, a microwave pump signal is provided as indicated by arrow 20 through the waveguide 18 into the cavity 28. The barrier 34 is transparent to the pump signal. However, the non-linear material 38 converts a substantial part of the pump signal into a third harmonic of the pump signal. For example, if the input pump signal is at 25 gHz, the harmonic signal is at 75 gHz. The harmonic signal is substantially trapped within the harmonic signal cavity 42. The dimensions of this cavity are designed to be tuned to this frequency. The harmonic signal is trapped within cavity 42 because of the reflective nature of the barrier 34. The harmonic signal is coupled out of the multiplier 10 through the waveguide 30, as indicated by the arrow 32.

Figure 2:
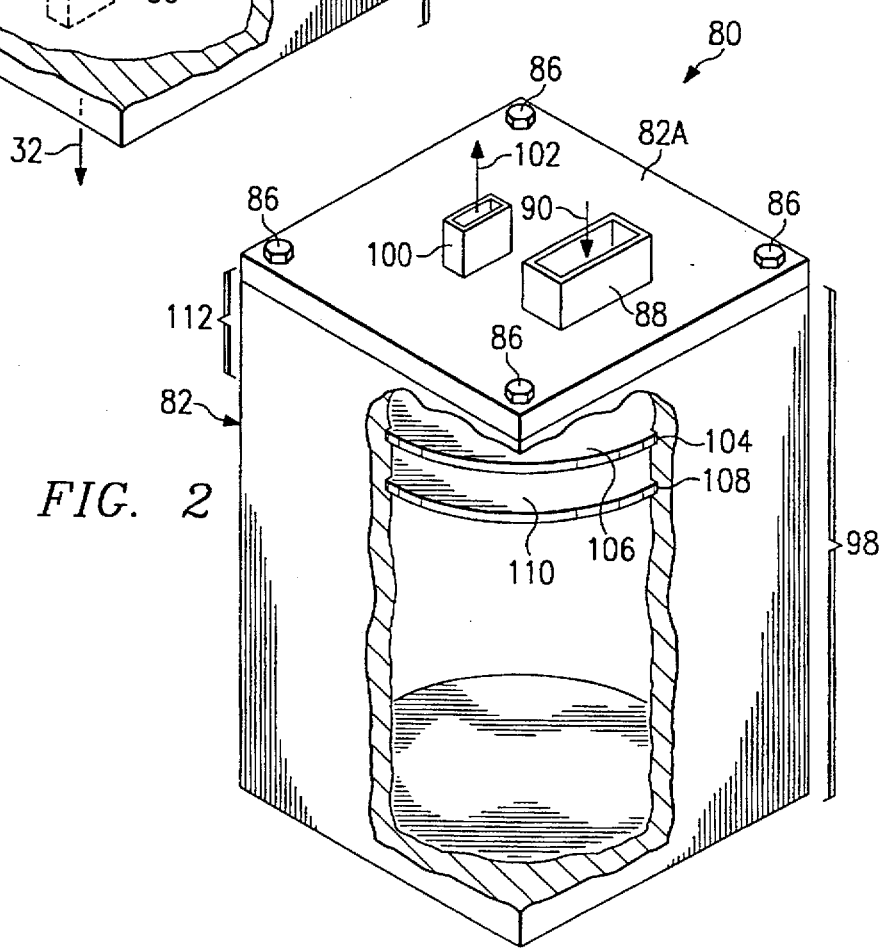
FIG. 2 is a perspective, cut-away view of a further frequency multiplier having input and output waveguides at the same end of the multiplier housing.

A further embodiment of the present invention is a frequency multiplier 80 which is illustrated in FIG. 2. The multiplier 80 has many similarities to the multiplier 10 described in FIG. 1. The frequency multiplier 80 includes a rectangular housing 82 that includes an end plate 82A. The plate 82A is secured to the lower portion of the housing 82 by screws 86.

A waveguide 88 receives a microwave pump signal as indicated by arrow 90. Waveguide 88 extends through the plate 82A to the interior of the housing 82.

The interior of the multiplier 80 has a cylindrical shape and comprises a pump signal cavity 98. The cavity 98 is dimensioned such that it is tuned to the pump signal.

A further waveguide 100 extends through the plate 82A for extracting microwave energy from the cavity 98. The waveguide 100 conveys principally microwave energy comprising a harmonic signal of the pump signal. The harmonic signal is indicated by an arrow 102.

The interior of the cavity 98 is provided with an annular groove 104 which receives a disk-shaped non-linear material 106. An annular groove 108 within cavity 98 supports a disk comprising a frequency selective barrier 110. The portion of the cavity 98 between the frequency selective barrier 110 and the end plate 82A comprises a harmonic signal cavity 112.

Referring to FIG. 2, the pump signal, as indicated by arrow 90, is transmitted through the waveguide 88 into the pump signal cavity 98 with the housing 82. The non-linear material 106 transforms a substantial percentage of the pump signal energy into a third harmonic of that signal. The harmonic signal is reflected by the barrier 110 and trapped within the harmonic signal cavity 112. However, the barrier 110 is transparent to the pump signal which is reflected within the cavity 98. The harmonic signal cavity 112 is tuned to the frequency of the harmonic signal. The harmonic signal is transmitted through the waveguide 100 as indicated by the arrow 102. The waveguides 18, 30, 88 and 100 shown in FIGS. 1 and 2 are positioned at the appropriate locations offset from the axis of the multipliers for optimum coupling of microwave energy depending upon the operating mode, as is well known in the art. These waveguides can be replaced by coaxial conductors to provide the input and extraction ports.

The cavities described for the frequency multipliers of the present invention may be either hollow or filled with a solid dielectric.

In FIGS. 1 and 2, the input signal port is preferably a WR-28 waveguide for Ka signal input and the extraction port is a WR-10 waveguide for the harmonic signal. The pump signal cavity 28 preferably is a TE 03 mode cavity and the harmonic signal cavity 42 is preferably a TE 09 mode cavity. The same modes are preferred for the corresponding cavities in FIG. 2.

A further embodiment of a microwave signal frequency multiplier in accordance with present invention is a multiplier 130 shown in FIG. 3. This frequency multiplier has a rectangular configuration. It includes a rectangular housing 132 which is fabricated of typical waveguide materials such as brass, copper or aluminum. The multiplier 130 has an input port 134 which comprises a waveguide for receiving a microwave pump signal as indicated by arrow 136. The input pump signal is transferred through holes 138 to the interior of the housing 132.

The interior of the housing 132 comprises a pump signal cavity 140. The cavity 140 is tuned to the frequency of the input pump signal.

A rectangular plate comprising a frequency selective barrier 142 is positioned within the cavity 140 and defines a harmonic signal cavity 144 which is within the cavity 140. The barrier 142 comprises the same material as previously described for the frequency selective barriers shown for the multipliers in FIGS. 1 and 2.

Within the harmonic signal cavity 144 there is included a rectangular plate of non-linear material 146 which functions to produce a third harmonic signal of the pump signal provided to the multiplier 130. The structure of the non-linear material 146 is the same as the non-linear material previously described in FIGS. 1 and 2.

The multiplier 130 is further provided with an extraction port 156 which comprises a waveguide that is connected via holes 158 to the harmonic signal cavity 144.

The input port and extraction port waveguide dimensions are the same for a selected embodiment as described for FIGS. 1 and 2.

The multiplier 130 shown in FIG. 3 functions essentially in the same manner as the multiplier 10 shown in FIG. 1. The input pump signal is coupled to the pump signal cavity 140 wherein the non-linear material 146 converts a portion of the input pump signal energy into a third harmonic signal. The frequency selective barrier 142 is substantially transparent to the pump signal but is substantially reflective to the third harmonic signal. The cavity 144 is tuned to this harmonic signal. The third harmonic signal is coupled through the holes 158 to the extraction port 156 which comprises a waveguide.

Figure 5:
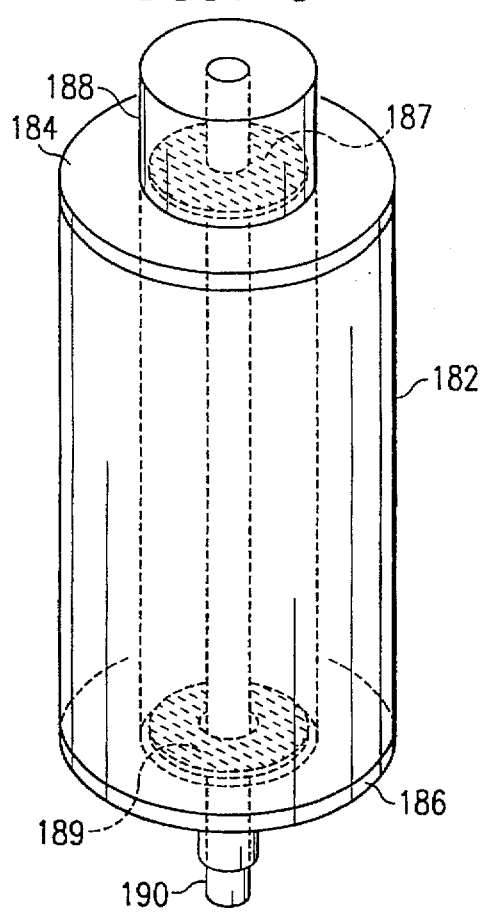
FIG. 5 is an illustration of coaxial conductor end segments for the cylindrical embodiment shown in FIG. 4.
Figure 6:
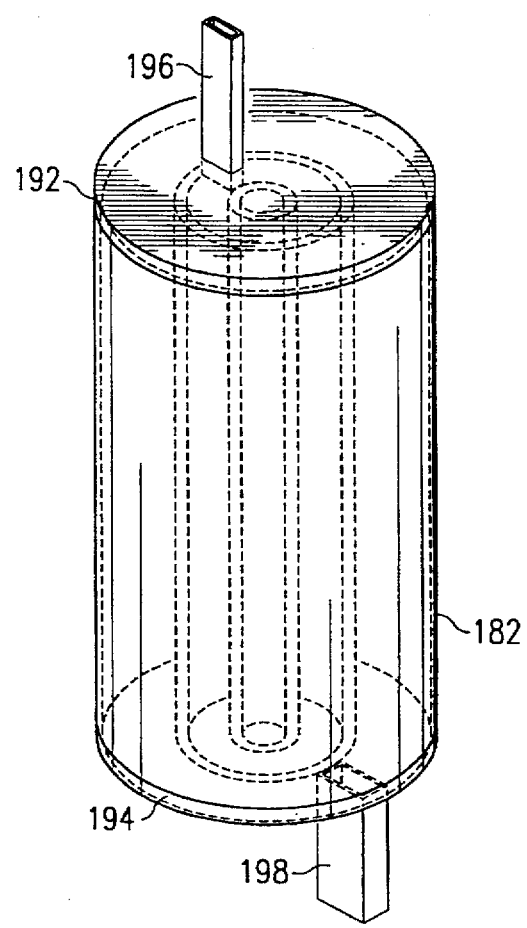
FIG. 6 is an illustration of waveguide conductor end segments for the cylindrical embodiment shown in FIG. 4.

A still further embodiment of the present invention is a microwave signal frequency multiplier 180 shown in FIG. 4. The multiplier 180 includes a cylindrical housing 182. Optional end segments for the multiplier 180 are shown in FIGS. 5 and 6. FIG. 5 illustrates end segments 184 and 186 which have respective coaxial conductors 188 and 190. FIG. 6 illustrates end segments 192 and 194 which have respective waveguides 196 and 198.

In FIG. 5, there is included a disk 187 adjacent conductor 188. The disk 187 is made of a frequency selective material as described above which is transparent to the pump signal and reflective to the harmonic signal. A disk 189 in end segment 186 comprises a frequency selective material which is reflective to the pump signal but transparent to the harmonic signal.

The end segments shown in either FIG. 5 or FIG. 6 may be coupled to the cylindrical housing 182 shown in FIG. 4 for the multiplier 180.

Further referring to FIG. 4, the multiplier 180 includes a central conductor 210 which may be either a solid tubular element or a cylinder with a hollow interior. The housing 182, end segments shown in FIGS. 5 and 6 and conductor 210 are preferably made of conventional microwave component materials such as brass, copper or aluminium.

A non-linear medium 212 has a cylindrical configuration and encircles the center conductor 210. The non-linear medium 212 and central conductor 210 are both coaxial with the cylindrical housing 182.

A cylindrical frequency selective barrier 214 is positioned coaxially within the housing 182 about the non-linear material 212 and defines a harmonic signal cavity 216 within the frequency selective barrier 214. The interior of the housing 182 comprises a pump signal cavity 218. Each of these cavities has a cylindrical configuration and are substantially tuned to the corresponding signal frequency. These cavities may be hollow or filled with a dielectric material.

Referring to FIGS. 4, 5 and 6, a microwave pump signal at a lower frequency, such as Ka band, is input through either the coaxial conductor 188 or waveguide 198 into the multiplier 180 to the pump signal cavity 218. The non-linear material 212 produces a third harmonic of the pump signal. The frequency selective barrier 214 substantially restricts the harmonic pump signal to the harmonic signal cavity 216. The harmonic signal is transferred out of the cavity 216 through either the coaxial conductor 190 or the waveguide 196.

The non-linear material 212 comprises the same type of material described in FIGS. 1, 2 and 3 and the frequency selective barrier 214 comprises the same material for the frequency selective barrier as described in FIGS. 1, 2 and 3. The preferred operating frequencies for the multipliers described in FIGS. 2, 3 and 4 are the same as described for multiplier 10 in FIG. 1.

Although several embodiments of the invention have been illustrated in the accompanying drawings and described in the foregoing detailed description, it would be understood that the invention is not limited to the embodiments disclosed, but is capable of numerous rearrangements, modifications and substitutions without departing from the scope of the invention.

What I claim is:

1. A microwave signal frequency multiplier comprising:
   a pump signal cavity having an input port for receiving a pump signal,
   a microwave frequency non-linear medium within said pump signal cavity for receiving said pump signal and producing therefrom a harmonic signal of said pump signal,
   a frequency selective barrier which defines a harmonic signal cavity within said pump signal cavity, said frequency selective barrier substantially transparent to said pump signal and substantially reflective to said harmonic signal, and
   an extraction port extending to said harmonic signal cavity for transferring said harmonic signal out of said harmonic signal cavity.

2. A microwave signal frequency multiplier as recited in claim 1 wherein said pump signal cavity and said harmonic signal cavity are cylindrical.

3. A microwave signal frequency multiplier as recited in claim 1 wherein said pump signal cavity and said harmonic signal cavity are rectangular.

4. A microwave signal frequency multiplier as recited in claim 1 wherein said non-linear medium is positioned between said frequency selective barrier and said extraction port.

5. A microwave signal frequency multiplier as recited in claim 1 wherein said non-linear medium is positioned between said frequency selective barrier and said input port.

6. A microwave signal frequency multiplier as recited in claim 1 wherein said frequency selective barrier has a disk configuration and said non-linear medium has a disk configuration.

7. A microwave signal frequency multiplier as recited in claim 1 wherein said input port and said extraction port are at opposite ends of said signal frequency multiplier.

8. A microwave signal frequency multiplier as recited in claim 1 wherein said input port and said extraction port are at a common end of said signal frequency multiplier.

9. A microwave signal frequency multiplier as recited in claim 1 wherein said input port is a waveguide and said extraction port is a waveguide.

10. A microwave signal frequency multiplier as recited in claim 1 wherein said input port is a coaxial conductor and said extraction port is a coaxial conductor.

11. A microwave signal frequency multiplier as recited in claim 1 wherein said non-linear medium is a semiconductor superlattice structure.

12. A microwave signal frequency multiplier as recited in claim 1 wherein said frequency selective barrier is a superlattice structure.

13. A microwave signal frequency multiplier comprising:
    a housing,
    a pump signal cavity within said housing,
    an input port extending through a first end of said housing to said pump signal cavity, said input port for receiving said pump signal,
    a microwave frequency non-linear medium within said pump signal cavity for receiving said pump signal and producing therefrom a harmonic signal of said pump signal,
    a frequency selective barrier located in said pump signal cavity between said first end of said housing and said non-linear medium and which defines a harmonic signal cavity within said pump signal cavity, said frequency selective barrier substantially transparent to said pump signal and substantially reflective to said harmonic signal, and
    an extraction port extending through a second end of said housing, which is opposite said first end of said housing, to said harmonic signal cavity for transferring said harmonic signal out of said harmonic signal cavity.

14. A microwave signal frequency multiplier as recited in claim 11 wherein said pump signal cavity and said harmonic signal cavity are cylindrical.

15. A microwave signal frequency multiplier as recited in claim 11 wherein said housing is rectangular.

16. A microwave signal frequency multiplier as recited in claim 11 wherein said frequency selective barrier has a disk configuration and said non-linear medium has a disk configuration.

17. A microwave signal frequency multiplier as recited in claim 11 wherein said input port is a waveguide and said extraction port is a waveguide.

18. A microwave signal frequency multiplier as recited in claim 13 wherein said non-linear medium is a semiconductor superlattice structure.

19. A microwave signal frequency multiplier as recited in claim 13 wherein said frequency selective barrier is a superlattice structure.

20. A microwave signal frequency multiplier comprising:
a housing,
a pump signal cavity within said housing,
an input port extending through a first end of said housing to said pump signal cavity, said input port for receiving said pump signal,
a microwave frequency non-linear medium within said pump signal cavity for receiving said pump signal and producing therefrom a harmonic signal of said pump signal,
a frequency selective barrier located in said pump signal cavity between a second end of said housing, which is opposite said first end of said housing, and said non-linear medium and which defines a harmonic signal cavity which is between said frequency selective barrier and said first end of said housing within said pump signal cavity, said frequency selective barrier substantially transparent to said pump signal and substantially reflective to said harmonic signal, and
an extraction port extending through said first end of said housing to said harmonic signal cavity for transferring said harmonic signal out of said harmonic signal cavity.

21. A microwave signal frequency multiplier as recited in claim 20 wherein said housing is rectangular.

22. A microwave signal frequency multiplier as recited in claim 20 wherein said pump signal cavity and said harmonic signal cavity are cylindrical.

23. A microwave signal frequency multiplier as recited in claim 20 wherein said frequency selective barrier has a disk configuration and said non-linear medium has a disk configuration.

24. A microwave signal frequency multiplier as recited in claim 20 wherein said input port is a waveguide and said extraction port is a waveguide.

25. A microwave signal frequency multiplier as recited in claim 20 wherein said non-linear medium is a semiconductor superlattice structure.

26. A microwave signal frequency multiplier as reeked in claim 20 wherein said frequency selective barrier is a superlattice structure.

27. A microwave signal frequency multiplier comprising:
a rectangular housing which encompasses a pump signal cavity therein,
a pump signal input port extending through a first wall of said housing to said pump signal cavity,
a microwave frequency non-linear medium within said pump signal cavity for receiving said pump signal and producing therefrom a harmonic signal of said pump signal,
a frequency selective barrier which defines a harmonic signal cavity between said frequency selective barrier and a second wall of said housing, said frequency selective barrier substantially transparent to said pump signal and substantially reflective to said harmonic signal, and
an extraction port extending through said second wall of said housing to said harmonic signal cavity for transferring said harmonic signal out of said harmonic signal cavity.

28. A microwave signal frequency multiplier as recited in claim 27 wherein said pump signal cavity and said harmonic signal cavity are rectangular.

29. A microwave signal frequency multiplier as recited in claim 27 wherein said input port is a waveguide and said extraction port is a waveguide.

30. A microwave signal frequency multiplier as recited in claim 27 wherein said non-linear medium has a planar, rectangular configuration and said frequency barrier has a planar, rectangular configuration.

31. A microwave signal frequency multiplier comprising:
a cylindrical housing having first and second end walls,
a center conductor positioned coaxially within said cylindrical housing,
an annular pump signal cavity located between said center conductor and said cylindrical housing,
a pump signal input port extending through said first end wall for providing a microwave pump signal to said pump signal cavity,
a cylindrical microwave frequency non-linear medium within said pump signal cavity and coaxial with said center conductor, said non-linear medium for receiving said pump signal and producing therefrom a harmonic signal of said pump signal,
a cylindrical frequency selective barrier which is coaxial with said center conductor and having a greater diameter that said non-linear medium, said cylindrical frequency selective barrier defining a harmonic signal cavity within said pump signal cavity between said center conductor and said cylindrical frequency selective barrier, said frequency selective barrier substantially transparent to said pump signal and substantially reflective to said harmonic signal, and
an extraction port extending through said second end wall to said harmonic signal cavity for transferring said harmonic signal out of said harmonic signal cavity.

32. A microwave signal frequency multiplier as recited in claim 31 wherein said center conductor is a solid element.

33. A microwave signal frequency multiplier as recited in claim 31 wherein said center conductor is a cylindrical element.

34. A microwave signal frequency multiplier as recited in claim 31 wherein said harmonic signal cavity has an annular configuration.

35. A microwave signal frequency multiplier as recited in claim 31 wherein said input port is a waveguide and said extraction port is a waveguide.

36. A microwave signal frequency multiplier as recited in claim 31 wherein said input port is a coaxial conductor and said extraction port is a coaxial conductor.

37. A microwave signal frequency multiplier as recited in claim 31 wherein said non-linear medium is a semiconductor superlattice structure.

38. A microwave signal frequency multiplier as recited in claim 31 wherein said frequency selective barrier is a superlattice structure.

* * * * *

UNITED STATES PATENT AND TRADEMARK OFFICE
CERTIFICATE OF CORRECTION

PATENT NO.  : 5,731,752
DATED       : March 24, 1998
INVENTOR(S) : James Richard Wood It is certified that error appears in the above-identified patent and that said Letters Patent is hereby corrected as shown below:

Column 2, line 51, delete "14," and insert --12A,--.

Column 6, line 66, delete "claim 11" and insert --claim 13--.

Column 7, line 2, delete "claim 11" and insert --claim 13--.

Column 7, line 4, delete "claim 11" and insert --claim 13--.

Column 7, line 8, delete "claim 11" and insert --claim 13--.

Column 7, line 54, delete "reeked" and insert --recited--.

Column 8, line 36, delete "that" and insert --than--.

Signed and Sealed this

Sixteenth Day of February, 1999

Attest:

*Acting Commissioner of Patents and Trademarks*

*Attesting Officer*